| United States Patent [19] | [11] Patent Number: 5,457,057 |
| --- | --- |
| Nath et al. | [45] Date of Patent: Oct. 10, 1995 |

[54] PHOTOVOLTAIC MODULE FABRICATION PROCESS

[75] Inventors: Prem Nath, Rochester Hills; Craig N. Vogeli, New Baltimore; Timothy Barnard, Rochester Hills, all of Mich.

[73] Assignee: United Solar Systems Corporation, Troy, Mich.

[21] Appl. No.: 266,527

[22] Filed: Jun. 28, 1994

[51] Int. Cl.⁶ .............................. H01L 31/18; H01L 31/20
[52] U.S. Cl. ...................... 437/2; 437/4; 437/51; 437/64; 437/65; 437/180; 437/181; 437/205; 437/207; 437/209; 136/244; 136/251; 136/256; 136/258
[58] Field of Search .................... 437/2–5, 51, 64–65, 437/180–181, 189, 205, 207, 209; 136/244, 251, 256, 258 AM

[56] References Cited

U.S. PATENT DOCUMENTS

| 4,127,424 | 11/1978 | Ullery, Jr. | 136/244 |
| 4,260,429 | 4/1981 | Moyer | 136/256 |
| 4,443,652 | 4/1984 | Izu et al. | 136/251 |
| 4,695,674 | 9/1987 | Bar-on | 136/256 |
| 4,773,944 | 9/1988 | Nath et al. | 136/249 |
| 5,084,107 | 1/1992 | Deguchi et al. | 136/256 |
| 5,092,939 | 3/1992 | Nath et al. | 136/251 |
| 5,151,373 | 9/1992 | Deguchi et al. | 437/2 |

*Primary Examiner*—Aaron Weisstuch
*Attorney, Agent, or Firm*—Gifford, Krass, Groh, Sprinkle, Patmore, Anderson & Citkowski

[57] ABSTRACT

Photovoltaic devices comprised of one or more encapsulated slabs of photovoltaic material are prepared by a process wherein a large area body of photovoltaic material is divided into a plurality of slabs. A photoactive area is defined within each slab, and defects therein passivated. Current collecting structures are affixed to each slab, and if the device includes a plurality of slabs, they are electrically interconnected. The front surfaces of the slabs are laminated with a transparent protective material, and the rear surfaces are bonded to a support plate. Also disclosed herein is a particular configuration of bus bar tape for interconnecting the slabs and an apparatus for preparing the current collecting wires.

27 Claims, 6 Drawing Sheets

PHOTOVOLTAIC MODULE FABRICATION PROCESS

FIELD OF THE INVENTION

This invention relates generally to photovoltaic devices. More specifically, the invention relates to the fabrication of photovoltaic panels. Most specifically, the invention relates to a method by which a large area portion of photovoltaic material may be fabricated into photovoltaic panels comprised of a plurality of electrically interconnected photovoltaic units.

BACKGROUND OF THE INVENTION

Photovoltaic devices are non-polluting and silent in operation. They are readily adapted to either a centralized, or distributed power generating system and as such, are an attractive alternative to fossil fuels and nuclear power sources. The relatively high cost of photovoltaic power has been a historical limitation upon its use; however, high volume processes for the preparation of thin film semiconductor devices have now dramatically decreased the cost of photovoltaic materials. It is now possible to manufacture thin film photovoltaic devices in a continuous, roll-to-roll processor. U.S. Pat. No. 4,485,125, the disclosure of which is incorporated herein by reference, describes one such process.

The output of a typical high volume process comprises a large area roll of substrate material coated with a multiplicity of semiconductor layers thereupon. In order to fabricate a practical device, it is generally necessary to convert the large area material output by the roll-to-roll process into a plurality of discrete devices optimized for particular voltage and power requirements. Processing steps typically include cutting the large area material into smaller area portions, testing the individual portions, applying current collecting structures such as collector grids and bus bars to the individual devices, assembling the devices into power generating modules, and affixing protective and/or support structures to the modules. These subsequent fabrication steps can be labor intensive, and they can possibly compromise the efficiency, and even the operability, of the resultant devices by introducing short circuits, high resistance contacts, and other defects of a like nature. It will thus be appreciated that the processing of the large area material can be a bottleneck which negates many of the benefits of high volume production.

There is a need for a methodology wherein large area bodies of photovoltaic material may be efficiently fabricated into devices specifically adapted for particular end uses. The present invention provides a production line method for device fabrication which is highly efficient, both in terms of required labor, time and the economical use of photovoltaic material. These and other advantages of the present invention will be readily apparent from the drawings, discussion and description which follow.

BRIEF DESCRIPTION OF THE INVENTION

There is disclosed herein a method for the manufacture of a photovoltaic panel from a large area of photovoltaic material of the type comprising a substrate electrode, a photovoltaic body disposed atop, and in electrical communication with the substrate electrode, and a transparent electrically conductive top electrode disposed atop the photovoltaic body. The method includes the steps of dividing the material into a plurality of individual slabs, each comprising a portion of the substrate electrode, photovoltaic body, and top electrode; and isolating a photoactive area within each slab which is substantially free of any defects which could establish a short circuit current path between the top electrode and the substrate electrode of the slab. The method further includes passivating any defect regions which may be present within the photovoltaic area, affixing a first bus bar tape to the slab in electrical communication with the substrate electrode, affixing a second bus bar tape to the slab so that it is electrically insulated from the substrate electrode, providing at least one current collecting member which is coated with an electrically conductive adhesive, and bonding the member to the top electrode of the slab and to the second tape so as to establish electrical communication therebetween. The method also includes the step of applying a transparent, protective coating to the slab so as to cover the top electrode and current collecting wire. In further processing steps, a plurality of the slabs are electrically interconnected in either a series or parallel relationship; a flexible, transparent, electrically insulating encapsulant is affixed to a front surface of each photovoltaic slab in a manner which leaves the back surface of each slab free of the encapsulant; and, a common backing plate is affixed to the back surface of each of the slabs of the plurality.

The step of isolating the photovoltaic area may comprise scribing away the photovoltaic body and top electrode portion of the slab in a region which defines a perimeter of the protected area, as for example by a laser scribe, water jet scribe, or chemical etching technique. Alternatively, the photoactive area may be isolated by cutting away those edges of the slab which were defined when the slab was divided from the web, through the use of a cutting technique which prevents shards of the top electrode from creating a short circuit current path between the top electrode and the substrate electrode of the slab. Passivation of defects within the photoactive area is preferably accomplished by a bias-etch passivation process. The bus bar tapes may be individually affixed to each slab, or a preformed, interconnected bus bar tape may be affixed to a plurality of slabs simultaneously whereby the steps of tape affixation and unit interconnection are carried out concomitantly. In some instances it has been found advantageous to ultrasonically bond the first tape to the substrate.

In some instances, the backing plate may comprise a preformed backing plate particularly configured for a specific end-use application. In other instances, the backing plate may be bent, drilled, or otherwise formed subsequent to its affixation to the photovoltaic slabs.

The present invention also includes a particular design of bus bar tape configured to be affixed to a plurality of distinct slabs of photovoltaic material, and to electrically interconnect those slabs in a preselected series or parallel relationship.

BRIEF DESCRIPTION OF THE DRAWINGS

FIG. 17 is a cross-sectional depiction of the photovoltaic slabs of

FIG. 16 further illustrating one manner in which the backing plate may be formed to provide a roofing panel;

Detailed Description of the Invention

The present invention relates to the efficient manufacture of high quality photovoltaic panels from a starting material which is a large area photovoltaic material generally in the form of a flexible, elongated web. As was described hereinabove, it is now possible to deposit layers of high quality semi-conductor material upon a flexible substrate in a continuous, plasma energized, roll to roll deposition process. The output of such processes typically comprises a coated web of substrate material which is approximately one foot wide and up to several hundred feet long. This coated web may be considered to be one single, very large area photovoltaic cell, and prior to its use it is desirable to process it into smaller area devices to suit particular applications.

Figure 1:
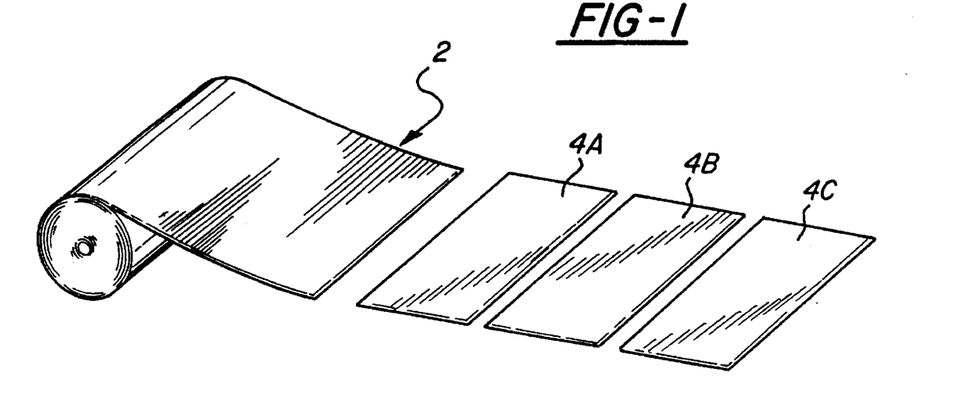
FIG. 1 is a schematic depiction of a web of photovoltaic material which has been divided into a plurality of individual slabs.

FIG. 1 depicts a large area web of photovoltaic material 2 which has been subdivided into a plurality of smaller area slabs 4A–4C. The web is typically formed upon a stainless steel, or other metallic, substrate base; and, the subdividing is typically accomplished by shearing, slitting, sawing, or any other such method as is well known in the sheet metal working art. In some instances, as will be detailed hereinbelow, the substrate may comprise a polymer, a sheet of glass or ceramic, or another such electrically insulating material, with an electrically conductive electrode layer supported thereupon.

Figure 2:
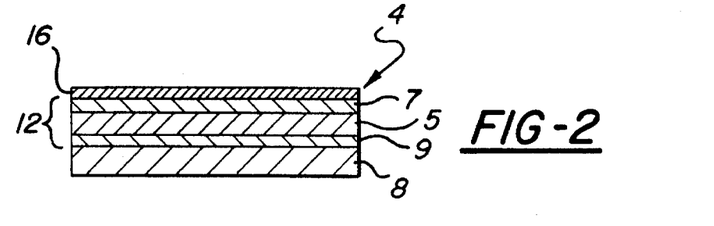
FIG. 2 is a cross-sectional view of one of the slabs.

Referring now to FIG. 2, there is shown a cross-sectional view of a typical slab 4 as employed in the present invention. This slab includes a substrate electrode 8, a photovoltaic body 12 disposed atop, and in electrical communication with, the substrate electrode 8, and a top electrode 16 disposed atop the photovoltaic body 12. The photovoltaic body, as is known in the art, operates to absorb incident photons and provide a photocurrent in response thereto. The current is collected at the substrate electrode 8 and the top electrode 16. In one preferred device, the substrate electrode 8 is a metallic electrode, and in the illustrated embodiment, the substrate electrode 8 comprises a sheet of stainless steel. As is known in the art, the substrate electrode may include additional layers to enhance its reflectivity, modify its texture or control its current carrying capacity. In some embodiments, the substrate electrode is comprised of a thin, electrically conductive layer which is supported upon an insulating substrate. All of the foregoing are encompassed within the disclosure of a substrate electrode. It will be appreciated that there are a variety of photovoltaic materials which may be employed in the practice of the present invention. One particularly preferred group of materials includes the thin film alloys of Group IV semiconductors, particularly the disordered alloys of silicon and germanium. However, it is to be understood that the present invention is not limited to such materials and may be practiced with equal advantage with other photovoltaic materials, including thin film materials such as CdS, $CuInSe_2$, organic materials, and the like.

In the illustrated embodiment, photovoltaic body 12 preferably comprises one or more triads of p-i-n configuration, wherein a layer of substantially intrinsic semiconductor material 5 is interposed between oppositely doped semiconductor layers 7, 9. A number of such triads may be stacked in a series relationship to enhance the efficiency of the device.

The top electrode 16 is fabricated from a transparent, electrically conductive material, typically a transparent conductive oxide (TCO) such as indium oxide, tin oxide, zinc oxide, cadmium oxide, and various combinations of the foregoing. It should be noted that in the various figures accompanying this disclosure, the vertical dimensions of the various layers have been preferentially distorted to better illustrate the semiconductor and electrode layers. The substrate electrode usually comprises a body of stainless steel of approximately 5 mils thickness, while the total thickness of the photovoltaic body 12 is less than 1 micron, as is the thickness of the top electrode 16.

It has been found that the step of dividing the web into a plurality of slabs tends to create a number of short circuit defects in the vicinity of the cut edges, as a result of the various layers, particularly the substrate 8 and top electrode 16, being pushed together. These defects would greatly decrease the efficiency of the photovoltaic device if they were allowed to remain. While it is possible to initially cut the web in a manner which prevents defect formation, such care is generally not compatible with a high volume production process; hence it has been found most expedient to eliminate these defects in subsequent processing steps.

After the web is divided into slabs, the slabs are each subjected to a process whereby a photoactive area therewithin is isolated so as to provide a region substantially free of any edge defects. Isolation may be carried out by a number of processes.

Figure 3A:
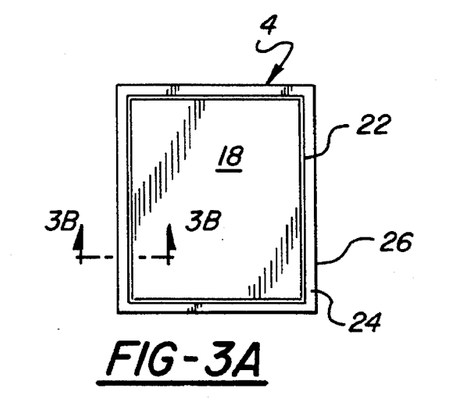
FIG. 3a is a top plan view of one of the slabs having a photoactive area thereof isolated.
Figure 3B:
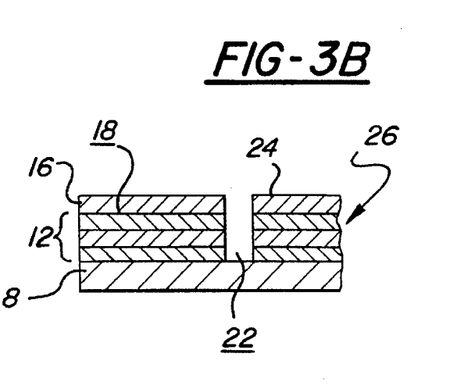
FIG. 3b is a cross-sectional view of the slab of FIG. 3a taken along line 3—3.

As illustrated in FIG. 3a, a photoactive region 18 within a slab 4 is defined by scribing a perimeter 22 thereabout. FIG. 3b is a sectional view of the slab 4 of FIG. 3a taken along line 3—3. Shown therein is a portion of the photoactive area 18 of the device, the scribed perimeter 22, and the region 24 outside the perimeter, which includes the cut edge 26. The scribe line 22 extends through the top electrode 16 and may optionally extend through photovoltaic body 12 but does not pass through the substrate electrode 8. It should be noted that in order to simplify the illustration, the various sublayers of the photovoltaic body 12 have not been separately illustrated.

The scribing may be accomplished by a number of techniques well known in the art. For example, scribing may be accomplished by a mechanical stylus, by the use of a laser, or by a high pressure jet of water. One particularly preferred method comprises chemical etching. In this process, an etchant material is applied to selected portions of the slab by screen printing and the slab is heated for a time sufficient to activate the etchant and dissolve the TCO. One preferred etchant is ferric chloride, and one particularly preferred formulation comprises a thickened ferric chloride paste. The paste is prepared by heating $FeCl_3.6H_2O$ to melting and mixing 100 ml of the molten salt with 25 ml of glycerine, 10 grams of graphite powder and sufficient wheat flour (about 10–20 grams) to provide a thickened mixture. The paste is applied by stenciling and the slab is heated in an oven at about 100° C. for about 10 minutes, after which the paste is washed away with water. Other etch techniques using resist coatings may be similarly employed.

In some instances, it may be desirable to isolate a photoactive area by cutting away the defect containing edges. It has been found that photovoltaic material having a TCO top electrode may be effectively cut from the rear surface thereof without generating defects, since, under these conditions, the TCO material breaks into shards which do not penetrate the semiconductor layers. This technique is disclosed in U.S. Pat. No. 4,704,369, the disclosure of which is incorporated herein by reference. It has similarly been found that the device may be effectively cut from the front surface thereof, without generating defects, if an adherent layer of protective material, such as a polymeric material, is disposed upon the top surface thereof. This technique is disclosed in U.S. patent application Ser. No. 881,345, filed May 11, 1992, the disclosure of which is incorporated herein by reference.

Figure 4A:
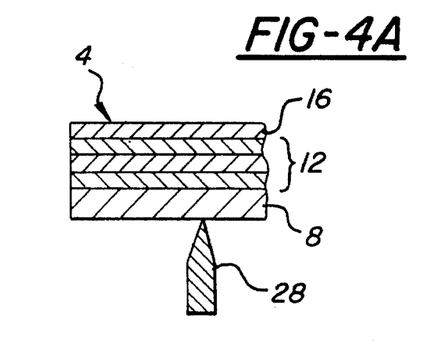
FIG. 4a is a cross-sectional view of a portion of a slab having its photoactive area isolated by a back side severing process.
Figure 4B:
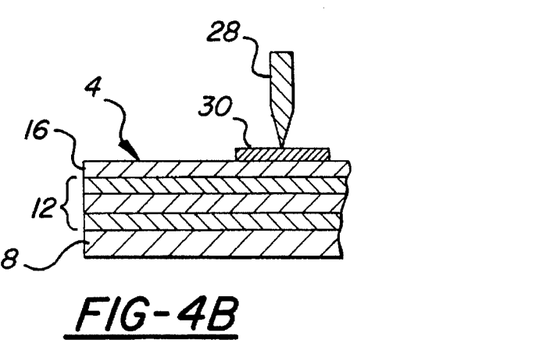
FIG. 4b is a cross-sectional view of a portion of a slab having its photoactive area isolated by a front surface severing process.

FIG. 4a depicts the process in which severing of the slab 4 is accomplished by the use of a blade 28 impinging on the substrate electrode side thereof. Similarly, FIG. 4b depicts technique in which the slab 4 is severed from the top electrode side thereof by a blade 28 after a protective layer 30 is interposed.

After the photoactive area is isolated, the slab is subjected to a passivation process wherein any defects which may be present within the photoactive area are removed or neutralized. As is known in the art, such defects may arise from imperfections in the substrate or in the various layers of the device, and they can operate to provide a short circuit current path through the device. A number of techniques have been developed for passivating defects, and they basically comprise etching away the TCO layer in the region of the defect, or converting it to a high resistivity material. One preferred technique comprises a bias-etch technique wherein a forward bias of approximately four volts is applied to the slab and it is immersed in a mild etchant material, typically a 10% aqueous solution of aluminum chloride hexahydrate. Passivation techniques are disclosed in U.S. Pat. Nos. 4,451,970; 4,464,823; 4,510,674 and 4,510,675, the disclosures of which are incorporated herein by reference.

Figure 5:
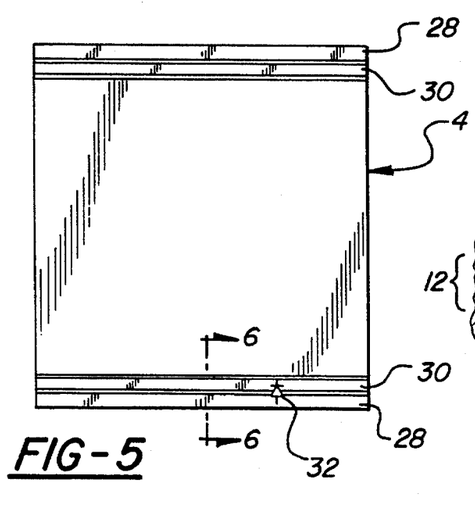
FIG. 5 is a top plan view of a slab with bus bar tapes affixed thereto.

After the passivation step, bus bar tapes are affixed to the slabs. These tapes are fabricated from an electrically conductive material, typically copper, brass or the like, and function to collect photogenerated current from the device and to channel it to power terminals. A first one of the bus bar tapes is affixed to the slab in electrical communication with the substrate electrode and a second bus bar tape is affixed so as to be electrically isolated from the substrate electrode. This second tape will ultimately establish electrical communication with the top electrode of the device. Referring now to FIG. 5, there is shown a slab 4 having a pair of first bus bar tapes 28 affixed to opposite edges and a pair of second bus bar tapes 30 affixed slightly inboard of the first tapes 28. A shunting diode 32 is affixed to a first 28 and a second 30 tape in such a matter so as to be in a reversed bias, i.e., non-conductive, state when the photovoltaic device comprised by the slab is operational. In the event that a catastrophic short circuit occurs within the device, the diode 32 will become forward biased and hence conductive, and will serve to establish electrical communication between the first 28 and second 30 bus tapes thereby shunting current from the device and preventing a runaway failure of the remainder of the photovoltaic module in which the device is incorporated.

Figure 6:
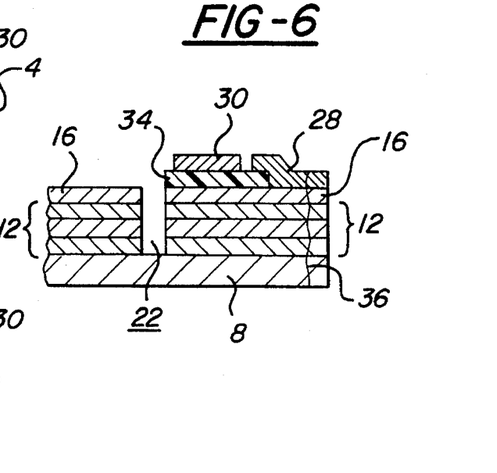
FIG. 6 is a cross-sectional view of the slab of FIG. 5 taken along lines 6—6.

Referring now to FIG. 6, there is shown a cross sectional view of the device of FIG. 5 taken along line 6—6. Shown in this drawing is the substrate 8, scribed perimeter 22, semiconductor layer 12, and top conductive electrode 16 of the slab as previously described. Also shown is a first bus bar tape 28 and a second bus bar tape 30. It will be noted that the entirety of the second bus bar 30 is placed atop an insulating body 34 so as to electrically isolate it from the remainder of the slab. The first bus tape 28 is only partially supported by the insulating body 34, in this embodiment, and electrical communication is established between the first tape 28 and the substrate electrode 8 by means of an ultrasonic bond 36. In accord with the present invention, it has been found that ultrasonic bonding, while heretofore limited to the joining of thermoplastic materials, may be advantageously employed to affix metallic bus tapes to the photovoltaic slab. The ultrasonic energy creates a strong bond between the tape and the substrate layer despite the presence of intervening semiconductor and TCO layers. Other methods for establishing communication, such as spot welding, soldering, and the like may be similarly employed although ultrasonic bonding is of particular advantage since it does not require any grinding or other preparatory steps to be carried out on the device. It is also to be understood that the tapes 28, 30 may be supplied in a roll form, with an adhesive backing to enable their ready affixation to the device.

Figure 7:
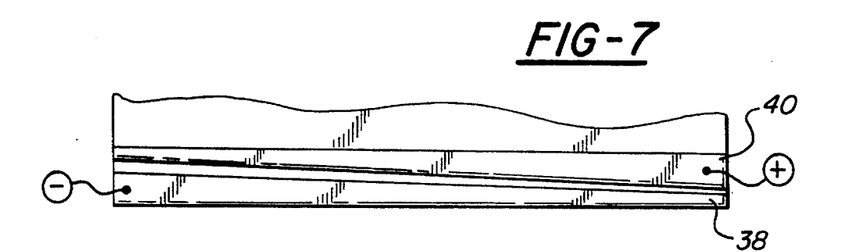
FIG. 7 is an illustration of one embodiment of tapered bus bar tapes in accord with the present invention.

Referring now to FIG. 7, there is shown another configuration of bus tapes. The tapes 38, 40 of FIG. 7 are tapered and are disposed in opposite orientations. The bus tapes 38, 40 function to direct photocurrent from the device to the terminals thereof. It will thus be appreciated that the current density in the bus tape will increase along its length. The use of tapered bus tapes results in a conservation of space, since the taper is established so that current density through the tape is constant. Therefore, the tape is fairly narrow at is first end and becomes progressively wider to accommodate the larger volume of current flowing therethrough. In the event that non-tapered bus bars are employed, the width thereof must be sufficiently great to accommodate the largest expected current. Tapered bus bars eliminate the need for excess capacity at the first end of the device and thereby save material and space. By placing the tapes in an opposite arrangement, and collecting current at opposite ends thereof, an overall space saving is realized.

Figure 8:
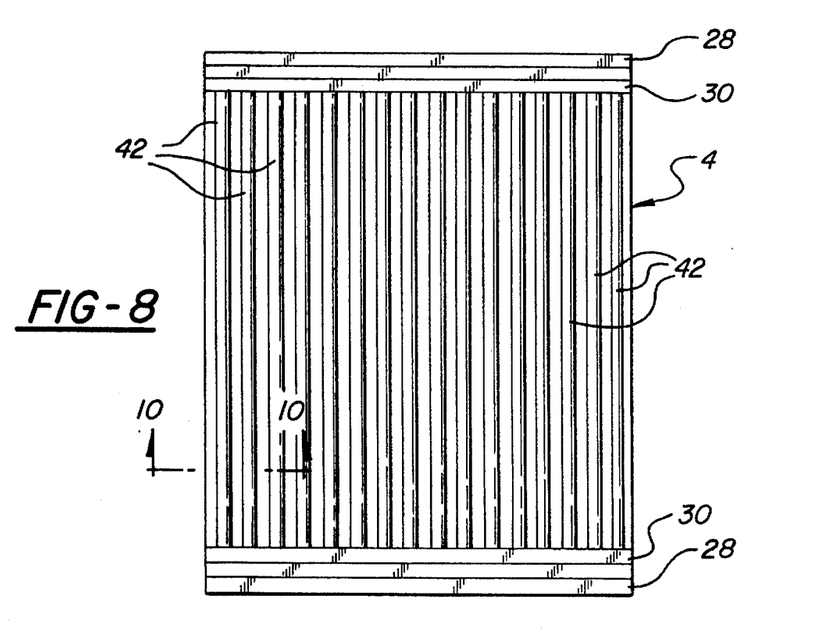
FIG. 8 is top plan view of a slab having current collecting wires affixed to the second bus bar tapes thereof.
Figures 9A, 9B, 10:
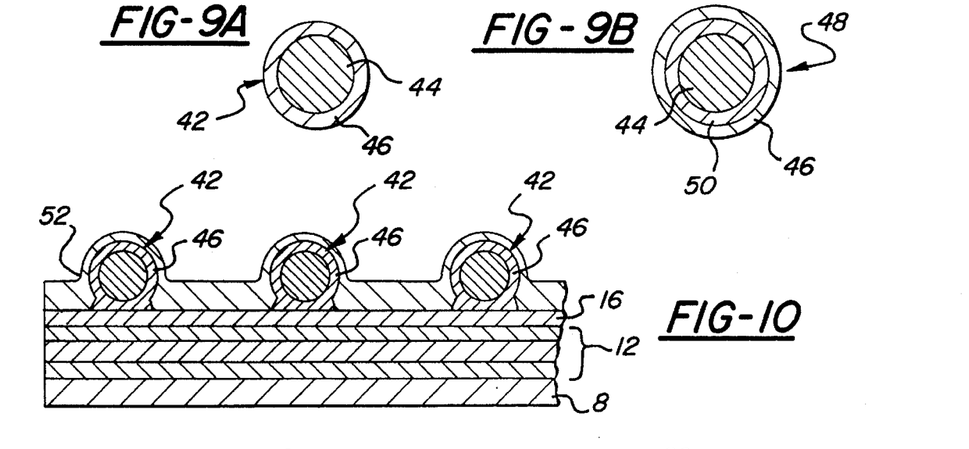
FIG. 9a is a cross-sectional view of one embodiment of current collecting wire.
FIG. 9b is a cross-sectional view of another embodiment of current collecting wire.
FIG. 10 is a cross-sectional view of the device of FIG. 8 taken along lines 10—10.

In a subsequent processing step, a current collecting structure is affixed to the top electrode of the device. In the illustrated embodiment this structure comprises a set of wires arranged in a grid-like fashion. It is to be understood that other members such as tapes may be similarly employed. These wires function to collect photogenerated current from the top electrode and carry that current to the second bus tapes. Referring now to FIG. 8, there is shown a slab 4, having first bus tapes 28 and second bus tapes 30 affixed thereto and further including a number of grid wires 42 thereupon. Referring now to FIG. 9A, there is shown one embodiment of grid wire 42 comprising a metallic core 44, preferably made from a good electrical conductor such as copper, aluminum, silver, or the like. Coated about the core 44 is an electrically conductive adhesive 46. In one embodiment, the adhesive 46 comprises a thermoplastic, hot melt adhesive which is preferably rendered electrically conductive by the inclusion of particles of silver, carbon, or similar material. In another embodiment, the adhesive is a solvent based adhesive, typically a mixture of a polymer solution together with conductive particles as noted above. The wire is preferably of about 50 to 100 microns in thickness and the coating is approximately 10–50 microns thick. The resistivity of the conductive layer 46 is preferably low, typically 0.1–10 ohm centimeter.

Referring now to FIG. 9B, there is shown another embodiment of wire 48. This wire also comprises a conductive core 44 and adhesive layer 46 as noted above, but further includes an additional layer 50 of an electrically resistive material, such as a carbon resistor paste. The inclusion of a resistive layer 50 provides a buffering function to the grid, which inhibits the flow of inordinately large current therethrough, as would happen in the instance where a short circuit developed in the device. The resistivity of the buffer layer will vary depending on device design; however a typical value for the resistivity of the carbon paste is approximately 50 to 300 ohm centimeter. It will be appreciated that the resistive material may comprise a discrete layer as shown in FIG. 9B, or may be directly incorporated into the adhesive layer 46 as illustrated in FIG. 9A. Thus, it will be seen that a typical resistivity range for the coating on the wire will be approximately 0.1 to 300 ohm centimeter, depending on whether or not resistive buffering is desired.

Figures 22, 23:
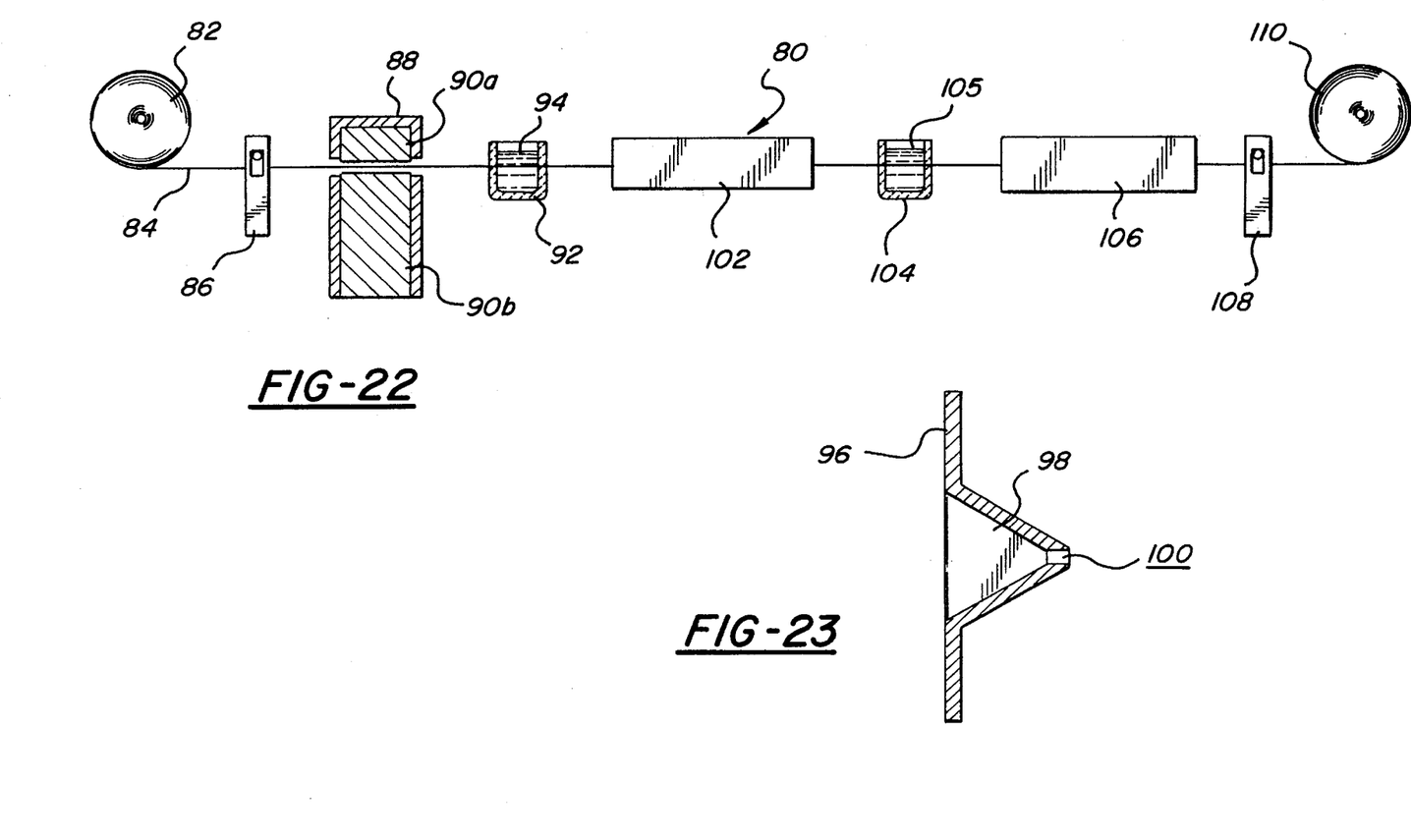
FIG. 22 is a schematic depiction, partially in cross-section of an apparatus for coating a current-collecting wire.
FIG. 23 is a cross-sectional view of an orifice which is employed in the apparatus of FIG. 22.

Referring now to FIG. 22, there is shown an apparatus 80 which may be employed for the preparation of coated wire stock material generally similar to that shown in FIGS. 9A and 9B. The apparatus 80 includes a feed spool 82, from which a length of wire 84 is unrolled for processing. The wire first proceeds through a first brake which imposes a drag on the wire, keeping it taut during processing. As illustrated, the brake 86 comprises a friction drag consisting of a pair of clamped blocks which are tightened about the wire 84. Other braking arrangements may be similarly employed. For example, a brake may be associated with the payout roll 82. The wire then proceeds to a cleaning station 88. As illustrated, the station includes a pair of pads 90a and 90b which are wetted with a cleaning solvent such as acetone or the like. After being cleaned, the wire proceeds to a first coating cup 92. The cup is filled with a coating material 94, and includes a pair of orifices configured to permit passage of the wire 84 through the cup 92. In passing through the cup 92, the wire 84 picks up and becomes coated with a layer of the coating material 94.

Referring now to FIG. 23, there is shown an enlarged, cross-sectional view of one configuration of orifice 96 which may be used in combination with the cup 92. The orifice 96 is preferably fabricated from a thin layer of metal, such as copper foil and includes a funnel shaped portion 98 having a small opening 100 defined at one end thereof. Generally, the orifice 96 is fabricated as a separate item and is fitted into the cup 92. In this manner, the orifice may be readily replaced when worn, or when wire size is changed. It has been found that the combination of the funnel shape, together with a relatively small opening, provides a hydrostatic force which tends to center the wire in the opening 100, and in this manner, the precise application of a controlled amount of coating material may be achieved.

After leaving the first coating cup 92, the wire 84 passes through a drying station 102. The drying station will generally be an electrically heated station, typically including a heater coil, infrared lamp, or the like and it functions to remove any residual solvent from the coating process and/or cure the coated material onto the wire 84. By control of the intensity of the heat source and the length of the station 102, drying and curing may be controlled. The illustrated apparatus further includes a second coating cup 104 generally similar to the first, and further including at least one orifice as noted above. The second cup 104 includes a second coating material 105 retained therein. The apparatus further includes a second drying tunnel 106 and a second brake or drag 108, as previously described. The apparatus further includes a take-up reel 110 for winding the coated wire.

It will be appreciated that the apparatus 80 of FIG. 22 is configured to deposit two concentric layers onto a wire so as to prepare a structure similar to that shown at reference no. 48 in FIG. 9b. If only a single coating is desired, as for example in the wire 42 at FIG. 9a, the second cup 104 and second drying station 106 may be dispensed with. Conversely, if further layers are desired, other cups and drying stations may be added to the line.

In one specific embodiment, the coated wire stock includes a first layer of relatively high conductivity silver paste material and a second, a higher resistivity layer of carbon-based resistive material. To fabricate this embodiment, the coating cup 92 is filled with a silver paste material such as the material sold by the DuPont Corporation under the designation 4927 silver paste. This material comprises a polymer binder, solvents, and silver particles. The second cup 104 is filled with a thermoplastic carbon-based paste sold by the Creative Materials Corporation of Massachusetts under the designation of 107–25 thermoplastic carbon paste. In some instances, it is desirable to thin this material with a solvent such as cellosolve acetate to improve its flow characteristics. In such instance, the drying tunnel station 106 is adjusted so as to dry the coating to a point where it will not unduly deform or stick to itself, but to a temperature low enough to prevent its melting. It has been found that this material may be readily laminated onto a photovoltaic device by the application of heat and pressure as will be described herein below.

Referring back to FIG. 8, it will be noted that the wire stock material 42 is assembled into the configuration of the current collecting structure upon the surface of the device, and subsequently affixed in electrical communication with the second electrode tapes 30 as well as with the top electrode layer 16 of the slab. The configuration of wires 42 may be affixed by a thermal lamination process, in those instances where a thermoplastic adhesive is employed, and this process may be carried out by hot rollers, or it may be carried out concomitant with subsequent top surface lamination, as will be described herein below. In those instances, where a solvent-based adhesive is employed, the wires 42 may be adhered through the use of an appropriately configured fixture. In some instances, coating of the wires 42 with adhesive in an apparatus similar to that of FIG. 22, may be implemented just prior to their affixation to the slab. It should also be noted that while FIG. 8 illustrates a series of discrete wires 42, a single, serpentine wire or a screen-like mesh may be similarly employed, as may other configurations of discrete wires. Other configurations of current collecting wires, and methods for their affixation are shown in U.S. Pat. Nos. 5,151,373 and 5,084,107; and the materials and techniques disclosed therein may be adapted to the present invention.

It will thus be seen that one aspect of the present invention includes a method for providing a current collecting structure on the TCO electrode of an electronic device. The method includes assembling one or more portions of an adhesively coated stock material onto the device in a configuration which corresponds to the current collecting structure and then affixing the configured stock material to the device by means of the adhesive. In this manner a number of different grid configurations may be easily fabricated.

Following the affixation of the current collecting structure, it has been found advantageous to apply a transparent, protective coating to the slab so as to facilitate further handling without problems occasioned by dislodging of grid wires, bus tapes, and the like. This layer typically comprises a layer of urethane polymer, silicone polymer, or the like and is applied by dipping or spraying. Referring now to FIG. 10, there is shown a cross sectional view of the device of FIG. 8, taken along lines 10—10, after the application of the protective coating. Visible in FIG. 10 is a portion of the slab comprising substrate 8, photovoltaic body 12 and top electrode 16, as well as three grid wires 42 as affixed by the adhesive layer 46 of each to the top electrode 16. Also visible is the protective coating 52. As illustrated, the protective coating 52 provides a conformal layer protecting the wires 42 as well as the top electrode 16 of the slab.

The slabs, having the current collecting wires and bus tapes, and the protective coating, are subsequently assembled into photovoltaic generating devices. A number of individual slabs are electrically interconnected to provide the requisite current and voltage for a particular application. In general, the slabs are electrically interconnected in a series relationship to increase voltage thereof, and in some instances a group of series connected slabs are subsequently connected in parallel to meet power requirements at the preselected voltage. In other instances, only a single slab will be required; as for example, in low voltage, high current applications.

Figure 11:
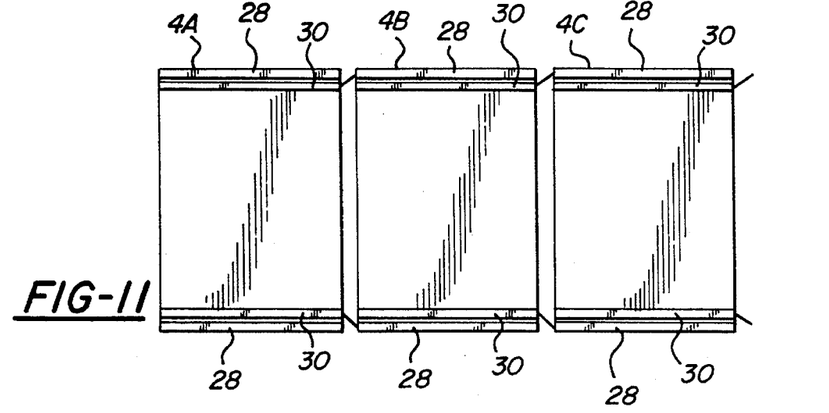
FIG. 11 is a top plan view of three electrically interconnected photovoltaic slabs.

Referring now to FIG. 11, there are shown three slabs 4A, 4B, 4C which have their bus tapes 28, 30 electrically interconnected in a series relationship. That is to say, the second bus tape 30 of the first slab 4A is electrically connected to the first tape 28 of slab 4B, and the second tape 30 of slab 4B is connected to the first tape 28 of slab 4C. It will also be noted that in the illustrations herein, each slab includes two sets of bus tapes, one at the top and one at the bottom thereof. This design minimizes the length of the grid wires through which photocurrent has to flow and further increases the efficiency of the device. In some instances, as for example where the grid wires are relatively large in diameter, or the device itself is relatively small in area, a single set of bus tapes may be employed.

Figure 12:
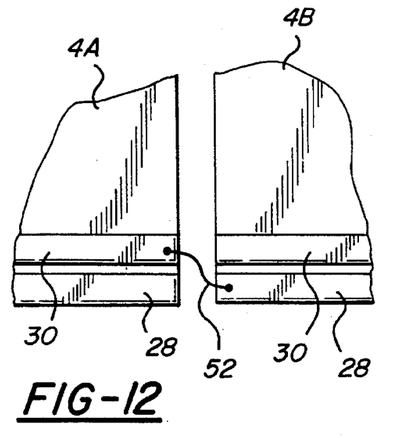
FIG. 12 is an enlarged view of a portion of two of the slabs of FIG. 11 that illustrate the interconnection thereof.
Figure 13:
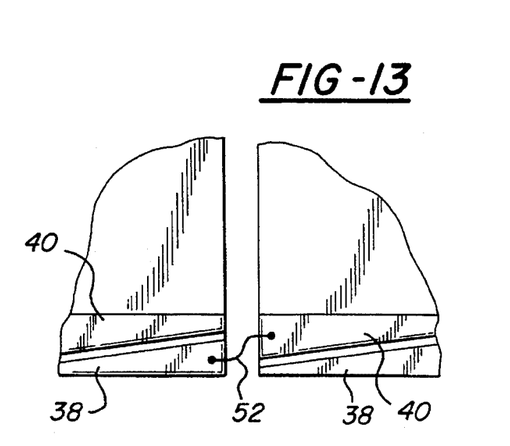
FIG. 13 is an enlarged view of a portion of two electrically interconnected slabs which include tapered bus bars.

Referring now to FIG. 12, there is shown an enlarged view of a portion of the first slab 4A and the second slab 4B, illustrating the manner in which the bus tapes thereof are interconnected. As shown, the interconnection is accomplished by a relatively small jumper wire 52, affixed by solder or other such electrically conductive material. FIG. 13 is a similar depiction showing the use of tapered bus tapes 38, 40.

Figure 14A:
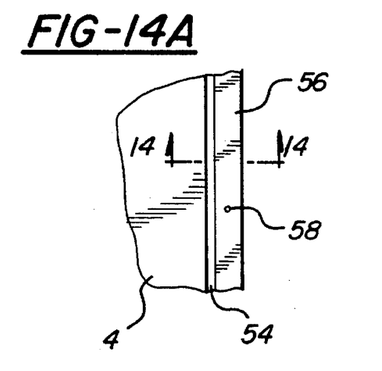
FIG. 14a is a bottom plan view of a portion of one of the photovoltaic slabs illustrating a back side terminal strip.
Figure 14B:
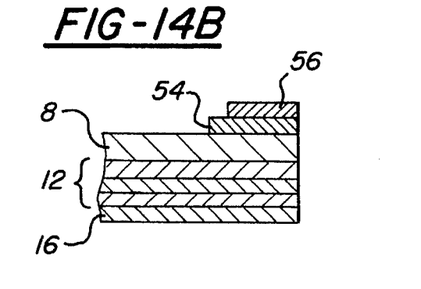
FIG. 14b is a cross-sectional view of the device of FIG. 14a taken along lines 14—14.

In some instances, it is further advantageous to affix a terminal strip to at least certain of the individual slabs comprising the photovoltaic device so as to provide a point at which power may be tapped from the device. Usually, the terminal strip is affixed to the back surface of the substrate of the device. FIG. 14A depicts a portion of a slab 4, viewed from the rear surface thereof showing a terminal strip 56 affixed thereto, atop a portion of insulating material 54. As illustrated, the terminal strip 56 includes a contact point 58 from which power may be tapped. It is to be understood that the terminal strip 56 is in electrical communication with one of the bus bars of the slab. In those instances where the terminal strip 56 is in electrical communication with the first bus tape which contacts the substrate electrode, the insulating body 54 may be dispensed with. In some instances it has been found advantageous to establish electrical communication between the terminal strip 56 and the bus tapes, by simply wrapping the tapes around the device to the back surface thereof. Each slab may include a first and a second terminal strip, in electrical communication with corresponding bus tapes, and in such instance, electrical interconnection between the slabs may be accomplished via the terminal strips. In other instances, only certain slabs in the unit may include terminal strips. For example, in the unit illustrated in FIG. 11 comprised of slabs 4A, 4B, and 4C, slab 4A may include a terminal strip in electrical communication with a first set of bus bar tapes thereof and slabs 4C, a terminal strip in electrical communication with a second set of bus tapes thereof. As a matter of practical expediency, all slabs can be made identical, by including two terminal strips on each, and connections and interconnections made appropriately.

Figure 15:
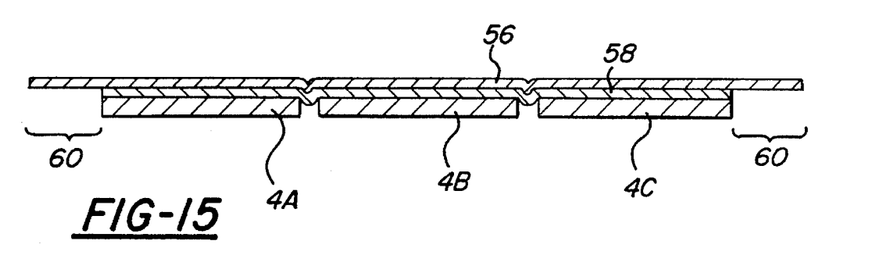
FIG. 15 is a cross-sectional view of three photovoltaic slabs having a front surface encapsulant member affixed thereto.
Figure 16:
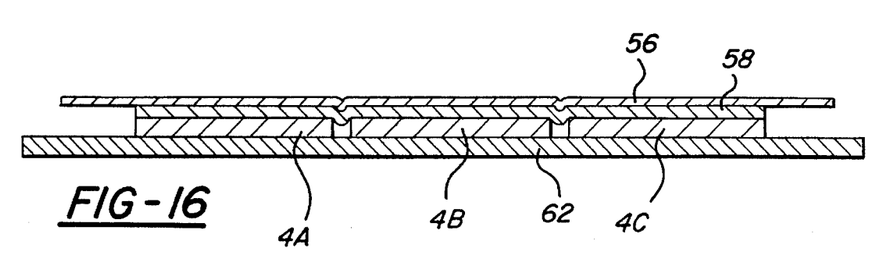
FIG. 16 is a cross-sectional view of three photovoltaic slabs generally similar to those of FIG. 15 and further including a backing plate affixed thereto.

In a subsequent processing step, a flexible, transparent, electrically insulating encapsulant member is affixed to the front surface of each of the interconnected slabs. It is notable that no encapsulant is affixed to the rear surface at this stage in processing. This represents a break with prior art techniques in which the interconnected slabs were typically laminated between dual layers of protective material. It has been found that by employing front surface lamination only, subsequent processing is facilitated. Referring now to FIG. 15, there are shown three slabs 4A, 4B, 4C, as generally illustrated previously; although it is to be noted that separate illustrations of the various electrode and photovoltaic layers of the slabs has been omitted for purposes of simplicity. In the figure, the flexible, transparent, electrically insulating encapsulant layer 56 is shown affixed to the slabs by means of an adhesive 58, which is also optically transparent. One preferred encapsulant 56 comprises a fluoropolymer sold under the name Tefzel® by the Dupont Corporation and the laminating adhesive 58 preferably comprises an ethylene vinyl acetate hot melt adhesive. It will also be noted that the encapsulant 56 is applied so that a free portion thereof 60, projects from the slabs 4. It has been found that the inclusion of this free portion 60 facilitates further processing of the device. After affixation of the encapsulant, the back surface of each slab of the device is affixed to a common backing plate 62, as shown in FIG. 167 In most instances, the backing plate 62 will comprise a sheet of metal which functions to support and rigidify the device. In some instances, the backing plate may comprise a layer of polymeric material, a layer of ceramic or the surface of a fabricated structure such as a vehicle or building. The backing plate 62 is affixed to the substrate side of the slabs 4 preferably by an adhesive, although other affixation methods such as welding, clamping, fixturing, or the like may be employed.

Figure 17:
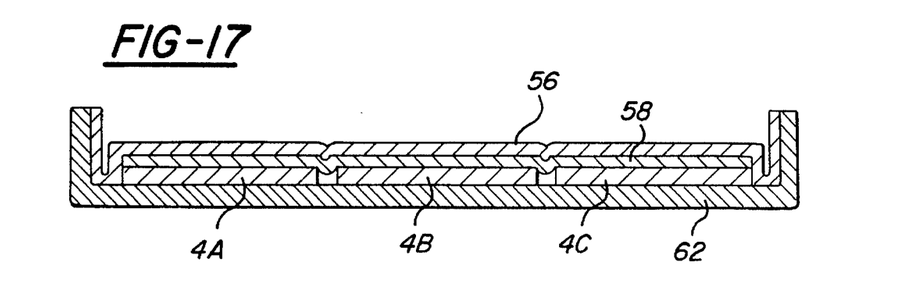

In some instances, the backing plate may be a preformed backing plate such as a roof panel or the like. In other instances it will be found more advantageous to form the backing plate to suit particular applications after affixation of the slabs. The fact that the device does not include back surface encapsulant material greatly facilitates the attachment and forming of the backing plate. As illustrated in FIG. 17, a portion of the backing plate 62 is bent upward to form a panel to be used in a batten and seam roofing structure. It will noted that the projecting portion 60 of the encapsulant layer 56 is readily adhered to the bent backing plate 62 so as to provide an environmentally tight seal. In those instances where additional layers of back surface encapsulant were interposed, it has been found that stresses at the bend point can cause delamination or poor quality of bends. A junction box may be affixed to the backing plate, the junction box including a first and a second electrical terminal, each in electrical communication with the photovoltaic units.

Figure 18:
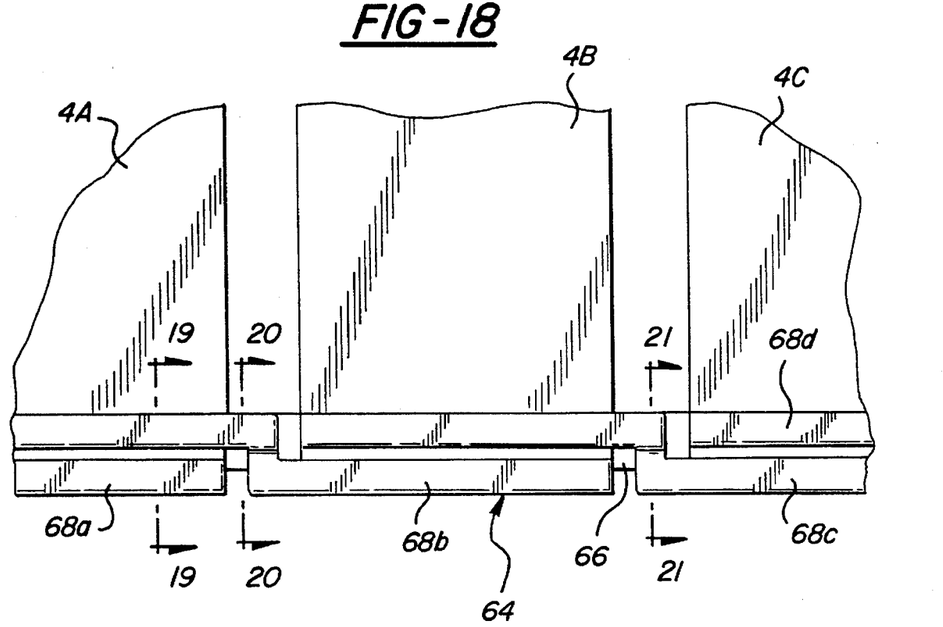
FIG. 18 is a depiction of three photovoltaic slabs electrically interconnected by a preformed bus bar tape in accord with the present invention.

While the preceding disclosure describes a fabrication process wherein individual bus bar tapes are first affixed to each of a plurality of slabs, and the tapes of adjoining slabs are subsequently interconnected; in keeping with the present invention, it is possible to combine the steps of tape application and interconnection, through the use of preformed, interconnected tape. Referring now to FIG. 18, there is shown a portion of three slabs 4A, 4B, and 4C electrically interconnected by a bus bar tape assembly 64 structured in accord with the present invention. The tape assembly 64 comprises a body of electrically insulating support tape 66 having a plurality of linked bus bar members 68 supported thereupon. Visible in FIG. 18 are portions of four bus bar members 68A–68D. As will be seen, particularly from reference to slab 4B and bus bar members 68B and 68C, the members each have a portion corresponding to the first bus bar tape as previously described, and a portion corresponding to the second bus bar tape as previously described, together with a linking portion. When affixed, the tape joins the substrate electrode of one slab to the top electrode of an adjoining slab so as to establish a series connection.

Figure 19:
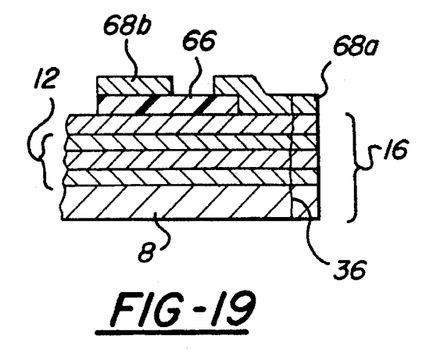
FIG. 19 is a cross-sectional view of the bus bar tape of FIG. 18 taken along lines 19—19.

Referring now to FIG. 19, there is shown a cross sectional view of slab 4A of FIG. 18, better illustrating the bus bar assembly. As will be noted, the slab includes the substrate electrode 8, photovoltaic body 12, and top electrode 16 as previously described. Affixed to the slab is the bus bar assembly which in the FIG. 19 depiction includes an insulating body 66, preferably formed from a polymeric material such as polyamide or the like. Disposed atop the insulating body 66 is a portion of bus bar member 68B as well as a portion of bus bar member 68A. It will be noted that the entirety of bus bar member 68B is atop the insulating body 66 and thereby electrically isolated from at least the substrate electrode 8. In accord with the previous disclosure, one or more current collecting wires will be affixed to this portion of the bus bar member 68B.

Figure 20:
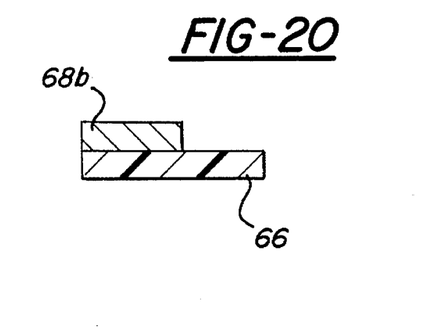
FIG. 20 is a cross-sectional view of the bus bar tape of FIG. 18 taken along lines 20—20.
Figure 21:
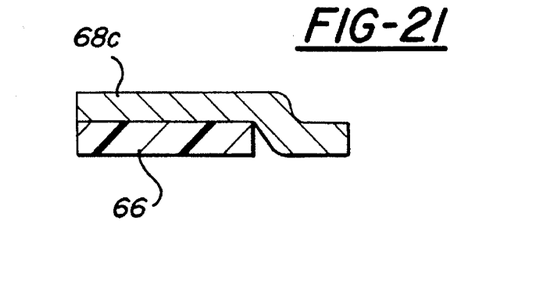
FIG. 21 is a cross-sectional view of the bus bar tape of FIG. 18, taken along lines 21—21.

It will be noted from FIG. 19 that the portion of the bus bar member 68A affixed to the slab 4A is only partially supported by the insulating member 66, and the remainder of the bus bar member 68A is in contact with the top electrode 16 of the slab and is, more importantly, in electrical communication with the substrate electrode 8, as for example by an ultrasonic bond or weld 36 as previously described. In this regard, the depiction of FIG. 19 is analogous to that of FIG. 6. Referring now to FIG. 20, there is shown a cross sectional view of the device of FIG. 18 taken along lines 20—20, in a region between adjacent slabs. In this region, the first bus bar member 68A has terminated and the assembly comprises the second bus bar member 68B and the insulating member 66 which supports it. Referring now to FIG. 21, there is shown a cross sectional view of the device of FIG. 18 taken along lines 21—21, which is also in a region between adjacent slabs, but at a point somewhat further removed from that shown in FIG. 20. Shown in FIG. 21 is a section of the bus bar assembly which establishes electrical communication between adjacent slabs. This portion is analogous to the connecting wires shown at 52 in FIG. 12 and 13. The section of FIG. 21 depicts a third bus bar member 68C as supported by the insulating member 66.

In accord with the present invention, the insulated bus bar assembly, as previously described, may be prepared to suit particular slab configurations and may be applied on an automated basis. The insulating tape 66 preferably includes an adhesive layer which enables it to be readily positioned onto the slabs. It should also be appreciated that while the FIGS. 19–21 embodiments depict a bus bar assembly which establishes a series interconnection between adjacent slabs, a parallel connection may be similarly established by configuring the tapes so that they are appropriately interconnected.

It will appreciated that the present invention provides for a simplified method whereby large area portions of photovoltaic material may be efficiently configured into encapsulated power generating modules which comprise a single photovoltaic body, or a plurality of bodies interconnected in a series, parallel, or mixed series-parallel configuration. The foregoing drawings, discussion, and descriptions are merely meant to illustrate particular embodiments of the present invention and are not meant to be limitations upon the practice thereof. Numerous modifications and variations will be obvious to one of skill in the art in view of foregoing. Therefore, it is the following claims, including all equivalents, which limit the scope of the invention.

We claim:

1. A method for the manufacture of a photovoltaic panel, said method including the steps of:

provinding a photovoltaic material comprising a substrate electrode; a photovoltaic body disposed atop, and in electrical communication with said substrate electrode, said photovoltaic body operative to absorb photons and provide a photocurrent in response thereto; and a transparent, electrically conductive top electrode disposed atop the photovoltaic body;

dividing photovoltaic said, material into a plurality of individual slabs, each slab comprising a portion of said substrate electrode, photovoltaic body, and top electrode;

isolating a photoactive area within each slab, said photoactive area being substantially free of any edge defects which establish a short-circuit current path between the top electrode and substrate electrode of said slab;

passivating any defect regions which may be present within said photoactive area;

affixing a first bus bar tape to said slab in electrical communication with the substrate electrode thereof;

affixing a second bus bar tape to said slab, said second tape being electrically insulated from said substrate electrode;

providing at least one current collecting member;

bonding said at least one current collecting member to the top electrode of said slab with an electrically conductive adhesive so as to establish electrical communication therewith;

establishing electrical contact between said at least one current collecting member and said second bus bar tape, whereby said second tape is in electrical communication with the top electrode;

applying a transparent, protective coating to said slab after affixation of said at least one current collecting member so as to cover said top electrode and said at least one member;

electrically interconnecting a plurality of said slabs;

affixing a flexible, transparent, electrically insulating encapsulant to a front surface of each electrically interconnected slab of said plurality so that a back surface of each of said slabs is not covered by said encapsulant; and, affixing a common backing plate to the back surface of each slab of said plurality.

2. A method as in claim 1, wherein the step of isolating said photoactive area comprises removing the top electrode of said slab in a region which defines a perimeter of said photoactive area.

3. A method as in claim 2, wherein the step of removing said top electrode comprises chemically etching said top electrode.

4. A method as in claim 2, wherein the step of removing said top electrode comprises scribing said top electrode with a laser.

5. A method as in claim 2, wherein the step of removing said top electrode comprises scribing said top electrode with a water jet.

6. A method as in claim 1, wherein the step of isolating said photoactive area comprises removing edges of the slab which were defined when the slab was divided from the photovoltaic material, said step of removing being accomplished through the use of a cutting technique which prevents shards of the top electrode from creating a short-circuit current path between the top electrode and substrate electrode of the slab.

7. A method as in claim 1, wherein the step of passivating defect regions comprises a bias-etch passivation process.

8. A method as in claim 1, wherein the electrical characteristics of the photoactive area of each slab are tested prior to the affixation of a bus bar tape thereto.

9. A method as in claim 1, wherein the step of affixing said first bus bar tape comprises adhesively affixing said first tape.

10. A method as in clam 1, wherein the step of affixing said first bus bar tape comprises ultrasonically bonding said first tape to said substrate electrode.

11. A method as in claim 1, wherein the step of affixing said first bus bar tape comprises welding said first tape to said substrate.

12. A method as in claim 1, wherein the step of affixing said second bus bar tape comprises adhesively affixing said second tape.

13. A method as in claim 1, wherein the step of affixing said second bus bar tape includes the further step of disposing a body of insulating material upon said slab and adhesively affixing said second tape onto the body of insulating material.

14. A method as in claim 1, wherein the steps of affixing said first bus bar tape and affixing said second bus bar tape comprise affixing said tapes onto a portion of said slab outside of the photoactive area thereof.

15. A method as in claim 1, wherein the step of providing said at least one current collecting member comprises providing a wire coated with an electrically conductive adhesive having a resistivity in the range of 0.1–300 ohm centimeter.

16. A method as in claim 1, wherein the step of providing said at least one current collecting member comprises providing a copper wire coated with a silver based, electrically conductive paste.

17. A method as in claim 16, wherein the step of providing said wire comprises providing a wire which is further coated with a layer of carbon based paste.

18. A method as in claim 1, wherein the step of providing said at least one current collecting member comprises providing a member coated with a thermoplastic, electrically conductive adhesive.

19. A method as in claim 18, wherein the step of bonding said member comprises applying heat and pressure to said member.

20. A method as in claim 1, wherein the steps of affixing said first bus bar tape and affixing said second bus bar tape comprise affixing tapes which are longitudinally tapered.

21. A method as in claim 1, including the further step of affixing a shunting diode in electrical communication with said first bus bar tape and said second bus bar tape of said slab.

22. A method as in claim 1, wherein the step of electrically interconnecting said plurality of interconnected slabs includes the further step of applying a terminal strip to the back surface of one of said slabs, said strip being in electrical communication with one of said first or said second bus bar tapes of said slab.

23. A method as in claim 1, wherein the step of affixing the backing plate comprises affixing a preformed backing plate.

24. A method as in claim 1, wherein the step of affixing a backing plate includes the further step of shaping said backing plate after it is affixed to the back surface of each of said units.

25. A method as in claim 1 wherein the step of affixing said encapsulant to the front surface of each photovoltaic unit comprises laminating a layer of fluorocarbon polymer to said front surface.

26. A method as in claim 1, including the further step of affixing a junction box to said backing plate, said junction box including a first and a second electrical terminal, each in electrical communication with said photovoltaic units.

27. A method for the manufacture of a photovoltaic panel, said method including the steps of: providing a photovoltaic material comprising a substrate electrode; a photovoltaic body disposed atop, and in electrical communication with said substrate electrode, said photovoltaic body operative to absorb photons and provide a photocurrent in response thereto; and a transparent, electrically conductive top electrode disposed atop the photovoltaic body;

dividing said photovoltaic material so as to separate a slab therefrom, said slab comprising a portion of said substrate electrode, photovoltaic body, and top electrode;

isolating a photoactive area within said slab, said photoactive area being substantially free of any edge defects which establish a short-circuit current path between the top electrode and substrate electrode of said slab;

passivating any defect regions which may be present within said photoactive area;

affixing a first bus bar tape to said slab in electrical communication with the substrate electrode thereof;

affixing a second bus bar tape to said slab, said second tape being electrically insulated from said substrate electrode;

providing at least one current collecting member which is coated with an electrically conductive adhesive;

bonding said at least one current collecting member to the top electrode of said slab so as to establish electrical communication therewith;

establishing electrical contact between said at least one current collecting member and said second bus bar tape, whereby said second tape is in electrical communication with the top electrode;

applying a transparent, protective coating to said slab after affixation of said at least one current collecting member so as to cover said top electrode and said at least one member;

affixing a flexible, transparent, electrically insulating encapsulant to a front surface of said slab so that a back surface thereof is not covered by said encapsulate; and     affixing a backing plate to the back surface of the slab.

* * * * *